US005814238A

United States Patent [19]
Ashby et al.

[11] Patent Number: 5,814,238
[45] Date of Patent: Sep. 29, 1998

[54] METHOD FOR DRY ETCHING OF TRANSITION METALS

[75] Inventors: Carol I. H. Ashby, Edgewood; Albert G. Baca, Albuquerque; Peter Esherick, Albuquerque; John E. Parmeter, Albuquerque; Dennis J. Rieger, Tijeras; Randy J. Shul, Albuquerque, all of N. Mex.

[73] Assignee: Sandia Corporation, Albuquerque, N. Mex.

[21] Appl. No.: 542,149

[22] Filed: Oct. 12, 1995

[51] Int. Cl.$^6$ .............................. B44C 1/22; C23F 1/00; C03C 15/00
[52] U.S. Cl. ........................ 216/62; 438/708; 438/710; 216/65; 216/66; 216/67; 216/75; 216/81
[58] Field of Search .................. 216/65, 67, 75, 216/62, 66, 81; 156/643.1, 646.1; 438/708, 710

[56] References Cited

U.S. PATENT DOCUMENTS

| | | | |
|---|---|---|---|
| 4,243,476 | 1/1981 | Ahn | 156/643 |
| 4,431,477 | 2/1984 | Zajac | 156/643 |
| 4,468,284 | 8/1984 | Nelson | 156/643 |
| 4,529,475 | 7/1985 | Okano | 156/643 |
| 4,659,426 | 4/1987 | Fuller et al. | 156/643 |
| 4,919,750 | 4/1990 | Bausmith et al. | 156/643 |
| 4,923,828 | 5/1990 | Gluck et al. | 437/225 |
| 4,985,990 | 1/1991 | Cronin | 29/852 |
| 5,092,967 | 3/1992 | Guess | 205/126 |
| 5,098,516 | 3/1992 | Norman | 156/666 |
| 5,129,991 | 7/1992 | Gilton | 156/635 |
| 5,147,500 | 9/1992 | Tachi | 156/643 |
| 5,185,058 | 2/1993 | Cahey, Jr. | 156/656 |
| 5,221,366 | 6/1993 | Roberts et al. | 148/22 |
| 5,262,001 | 11/1993 | Takehara | 156/643 |
| 5,338,398 | 8/1994 | Szwejkowski et al. | 156/655 |
| 5,350,484 | 9/1994 | Gardner | 156/628 |
| 5,368,687 | 11/1994 | Sandhu et al. | 156/664 |
| 5,431,774 | 7/1995 | Douglas | 216/57 |

FOREIGN PATENT DOCUMENTS 04173988  6/1992  Japan.

OTHER PUBLICATIONS

James E. Huheey, *Inorganic Chemistry: Principles of Structure and Reactivity*, (Harper & Row, New York, 1972), pp. 276–286, 347–358, 441–464.

*Primary Examiner*—R. Bruce Breneman
*Assistant Examiner*—George Goudreau
*Attorney, Agent, or Firm*—John P. Hohimer

[57] ABSTRACT

A method for dry etching of transition metals. The method for dry etching of a transition metal (or a transition metal alloy such as a silicide) on a substrate comprises providing at least one nitrogen- or phosphorous-containing π-acceptor ligand in proximity to the transition metal, and etching the transition metal to form a volatile transition metal/π-acceptor ligand complex. The dry etching may be performed in a plasma etching system such as a reactive ion etching (RIE) system, a downstream plasma etching system (i.e. a plasma afterglow), a chemically-assisted ion beam etching (CAIBE) system or the like. The dry etching may also be performed by generating the π-acceptor ligands directly from a ligand source gas (e.g. nitrosyl ligands generated from nitric oxide), or from contact with energized particles such as photons, electrons, ions, atoms, or molecules. In some preferred embodiments of the present invention, an intermediary reactant species such as carbonyl or a halide ligand is used for an initial chemical reaction with the transition metal, with the intermediary reactant species being replaced at least in part by the π-acceptor ligand for forming the volatile transition metal/π-acceptor ligand complex.

69 Claims, No Drawings

METHOD FOR DRY ETCHING OF TRANSITION METALS

This invention was made with Government support under Contract No. DE-AC04-94AL85000 awarded by the U.S. Department of Energy. The Government has certain rights in the invention.

FIELD OF THE INVENTION

The present invention relates to dry etching of transition metals, and in particular to a selective process for dry etching of transition metals that has applications for patterning transition metal thin films during the manufacture of electronic and/or photonic integrated circuits, and for removing transition metal contaminants from wafer surfaces during the manufacture of such circuits.

BACKGROUND AND SUMMARY OF THE INVENTION

The use of transition metals for forming interconnects between devices in integrated circuits is becoming of increasing importance as the device size of such circuits is reduced. The use of a transition metal or transition metal alloy having a conductivity higher than aluminum is advantageous for reducing an RC time constant in integrated circuits, thereby allowing integrated circuit structure geometries to shrink while maintaining desirable levels of performance improvement. Furthermore, during integrated circuit manufacture, transition metal impurities such as copper, iron and gold may adhere to device surfaces producing undesirable charge traps and affecting device performance. Thus, new etch chemistries are needed for removing such transition metal impurities from device surfaces; and also for patterning transition metal interconnects for both electronic and photonic integrated circuits.

U.S. Pat. No. 4,159,917 to Gluck discloses a method for removing metal impurities from semiconductor materials by exposure to the combination of nitric oxide and hydrogen chloride in a furnace at a high temperature in the range of 850° to 1100° C. Such a process is not compatible with photoresists or the like that are generally used in later stages of integrated circuit manufacture for the patterning of metal interconnects.

U.S. Pat. No. 4,431,477 to Zajac discloses the use of nitrous oxide in combination with a fluoro compound for preferential etching of polysilicon and silicon nitride in comparison to the etching of silicon dioxide. There is no suggestion or teaching by Zajac of the use of such an etchant composition for transition metals.

U.S. Pat. No. 4,468,284 to Nelson discloses a dry etchant comprising $NO^+$ in combination with chlorine for etching an aluminum-copper alloy containing up to about 6% copper by weight; with the $NO^+$ acting to oxidize the copper to form $CuCl_2$, and the chlorine acting to produce $Al_2Cl_6$ for removing the alloy as a volatile $CuCl_2 \cdot Al_2Cl_6$ complex. This dry etch process is specific to an aluminum-copper alloy since it requires the presence of aluminum for formation of the volatile complex.

U.S. Pat. No. 4,659,426 to Fuller et al discloses a plasma etching process for etching of refractory metals and their silicides and forming volatile metal carbonyls and/or carbonyl halides.

U.S. Pat. No. 4,923,828 to Gluck et al discloses a process effective for removing metallic impurities from the surface of a silicon device by using an afterglow gas composed of a mixture of nitric oxide, anhydrous hydrochloric acid and an inert carrier gas. The process produces an undesirable by-product film of silicon oxynitrochloride which is removed during another process step using an afterglow mixture of $CH_4$ and $H_2$ or $CHF_3$ and $CO_2$ which results in formation of a fluorocarbon polymer layer which must be removed by yet another process step using an afterglow of oxygen.

U.S. Pat. No. 5,129,991 to Gilton discloses photo etching of transition metals and transition metal alloys by an etchant gas adsorbed directly onto a surface of the metal to be etched and activated by secondary (photoemitted) electrons emitted from the metal surface in response to an impinging light beam having an energy exceeding a photoemission threshold of the metal. The etched metal is removed as a volatile metal-halide reaction product. Gilton teaches away from direct activation of the etchant gas by the light beam.

U.S. Pat. No. 5,338,398 to Szwejkowski et al discloses a plasma etching process specific to tungsten silicide. This process is based on the use of chlorine in combination with an oxygen-bearing gas, and provides a high selectivity to both photoresist and silicon oxide.

U.S. Pat. No. 5,350,484 to Gardner et al discloses etching of a metal film for the fabrication of semiconductor devices by implanting ions into a preselected region of the metal film to form a converted layer of metal compounds in the region, and selectively removing the converted layer by etching the metal compounds with an etchant chosen to prevent substantial etching of the metal film. A disadvantage of this method is the requirement for an implant barrier below the metal film to prevent possible damage to devices from high-energy implanted ions.

Although the prior art methods have found some success for dry etching of specific transition metals, there remains a need for an etch chemistry that is widely applicable to the transition metals for use both in cleaning transition metal impurities from a semiconductor wafer, and for patterning of transition metal interconnects.

Accordingly, it is a primary object of the present invention to provide a method for dry etching of transition metals (including transition metal alloys such as transition metal silicides) for use in semiconductor manufacturing operations, including removing impurities from semiconductor wafer surfaces, and patterning of metal thin films for forming interconnects.

An additional object of the present invention is to provide a method for dry etching one or more transition metals that is highly selective to the specific metals being etched while being substantially non-selective (i.e. non-reactive) to other materials including semiconductors, insulating layers, photoresist layers, or the like.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a method for dry etching of a transition metal on one or more predetermined substrates is provided. The method comprises the steps of providing at least one π-acceptor ligand in proximity to the transition metal with each π-acceptor ligand being selected from the group consisting of nitrogen-containing π-acceptor ligands and phosphorous-containing π-acceptor ligands; and dry etching the transition metal by forming a volatile complex comprising the π-acceptor ligand and the transition metal. Each π-acceptor ligand may be provided from activation of a nitrogen- or phosphorous-containing ligand source gas by contacting the ligand source gas with a plasma (e.g. in a reactive ion etching system, a downstream plasma etching system or the like); or with energized particles such as photons, electrons, ions, atoms, or molecules. The transition metal may be provided as a thin-film layer deposited above the substrate and overcoated with a patterned masking layer for exposing a predetermined portion of the transition metal layer for etching thereof. Alternately, the transition metal may be in the form of an impurity to be removed from a surface of the substrate or wafer.

Other objects, advantages and novel features of the invention will become apparent from the following detailed description thereof when considered in conjunction with the accompanying drawings.

BRIEF DESCRIPTION OF THE DRAWINGS

No drawings are included with the present application.

DETAILED DESCRIPTION OF THE INVENTION

As will be recognized by those skilled in the art, the present invention teaches an entire class of processes or methods which may be used for dry etching transition metals for the fabrication of electronic and/or photonic integrated circuits. Thus, the present invention relates to a class of chemical reagents, termed π-acceptor ligands containing nitrogen or phosphorous; and these π-acceptor ligands may be used to etch a wide variety of transition metals (including transition metal alloys). (A ligand is defined herein as an ion, molecule, or molecular group that binds to another chemical entity to form a larger complex.)

Examples of nitrogen-containing π-acceptor ligands that may be used for practice of the present invention include nitrosyl ligands (NO), isonitrile ligands (RNC), cyanide ligands (CN) and isocyanide ligands (RCN). (R is defined herein as an organic moiety such as methyl, ethyl, methoxy, or the like as known to the art.) Examples of phosphorous-containing π-acceptor ligands for dry etching use according to the present invention include phosphine ligands ($PF_3$, $PCl_3$, $PBr_3$, $PR_3$), phosphite ligands [$P(OR)_3$] and substituted phosphine ligands [$PCl_2OR$, $PCl_2R$, $PBr_2R$, $PCl(OR)_2$, $PClR_2$]. For certain embodiments of the present invention, more than one of the π-acceptor ligands identified above may be provided for dry etching of a transition metal on a predetermined substrate.

The classes of π-acceptor ligands as defined above may react with a transition metal to form a volatile transition metal/ligand complex thereby etching the metal and removing it from a surface of a predetermined substrate (i.e. a wafer) to form a patterned metal interconnect, or to clean a transition metal impurity deposit from the surface. Alternately, an intermediary reaction product may be formed from the transition metal to be etched and an intermediary reactant species (such as a halide ligand and/or a carbonyl ligand), with the intermediary reactant species being substituted or replaced at least in part by one or more π-acceptor ligands for forming the volatile transition metal/ligand complex.

Transition metals are defined herein to include any element in a "B" grouping of a periodic chart of the elements (i.e. groups IB–VIII B of the periodic chart) or any alloy comprising one or more elements from the "B" grouping of the periodic chart. Specifically transition metals as defined herein include the elements Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg, Ac, Rf, Ha and alloys (e.g. silicides, nitrides, carbides) formed therefrom.

By way of example, the present invention will be further described hereinafter with particular emphasis given to a specific π-acceptor ligand, nitrosyl (also termed NO), and a specific transition metal, tungsten. However, it will be understood by those skilled in the art that the teaching of the present invention is very broad and applies to any π-acceptor ligand containing nitrogen or phosphorous, and to any transition metals (including alloys such as transition metal silicides, nitrides, carbides etc.) that may be reacted with or combined with the nitrogen- or phosphorous-containing π-acceptor ligand for forming a volatile complex, thereby removing the metal or alloy from a surface of a predetermined substrate (e.g a semiconductor substrate comprising silicon, or a II–VI or III–V compound semiconductor such as GaAs, InP or the like). The dry etching according to the present invention may take place in a reaction chamber containing one or more predetermined substrates (i.e. wafers) to be etched, with one or more of the nitrogen- or phosphorous-containing π-acceptor ligands being formed by activation of a ligand source gas by a plasma, or by interaction with energized particles, or provided directly from a ligand source gas. Accordingly, the scope of the present invention is not intended to be limited except as specified in the accompanying claims.

For patterning of interconnects (defined herein as electrical interconnections between a plurality of electronic and/or photonic devices formed on a predetermined substrate) a thin film of a transition metal is deposited (e.g. by sputtering) over a surface of the substrate. Thereafter, a masking layer (e.g. a photoresist layer) is formed over the metal thin film with openings defined in the masking layer for exposing a portion of the metal thin film to be removed for patterning the interconnects. (These openings or windows in the masking layer may represent fractional areas ranging from less than 1 percent up to about 99 percent of the total area of the predetermined substrate.)

According to the present invention, the exposed portion may be removed by providing at least one nitrogen- or phosphorous-containing π-acceptor ligand in proximity to the transition metal thin film and dry etching the transition metal thin film and forming a volatile complex comprising the nitrogen- or phosphorous-containing π-acceptor ligand and the transition metal. In some preferred embodiments of the present invention, an intermediary reactant species (such as a halide ligand and/or a carbonyl ligand) may be provided in addition to the nitrogen- or phosphorous-containing π-acceptor ligand, with the intermediary species forming an intermediary reaction product or complex with the transition metal prior to a further chemical reaction with the nitrogen- or phosphorous-containing π-acceptor ligand for forming a final reaction product comprising a volatile transition metal/π-acceptor ligand complex. (The halide ligand may be generated in a plasma, directly from a gas, or by particles interacting with any predetermined halogen source gas including $Cl_2$, $BCl_3$, NOCl, NOBr, $BrF_3$, HF, $F_2$, $BF_3$, $CF_4$, $COF_2$, NOF and $SF_6$ or the like. The carbonyl ligand may be similarly generated in a plasma, directly from a gas, or by particles interacting with any predetermined carbonyl source gas including CO, $CO_2$ and $COF_2$.) The volatile complex formed by dry etching may further include an organic ligand such as an alkyl ligand, substituted alkyl ligand, aryl ligand, substituted aryl ligand, benzene-type ligand, substituted benzene-type ligand, aromatic ring ligand, or the like as may be preferred to increase a volatility of the complex. Carrier gases such as $N_2$, Ar, He, $H_2$, $O_2$ or the like may also be provided for forming the plasma, for generating the p-acceptor ligand, for generating the final reaction product complex, for controlling an etching rate of the transition metals, or a combination thereof.

Each nitrogen- or phosphorous-containing π-acceptor ligand for use with the present invention may be generated from a predetermined ligand source gas. In some preferred embodiments of the present invention using nitrosyl as a nitrogen-containing π-acceptor ligand, the nitrosyl ligand may be formed directly and simply from gaseous nitric oxide. In the gas phase, nitric oxide is a stable free radical capable of donating or accepting an electron and forming the nitrosonium ion, $NO^+$, or the nitrosyl ion, $NO^-$, respectively, depending upon particular chemical reaction conditions.

For the formation of nitrosyl and other types of nitrogen- or phosphorous-containing π-acceptor ligands as defined hereinbefore, the ligands may also be generated from predetermined ligand source gases by activation of the gas molecules (i.e. to generate radical etch gas fragments) by contacting the gas molecules with a plasma provided by a reactive ion etching system, a downstream plasma etching system or any other type of plasma etching system as known to the art.

A downstream plasma etching system generally comprises a plasma generation chamber wherein a direct-current (dc), radio-frequency (rf) or microwave plasma activates gas molecules forming an afterglow which is then conveyed by a gas flow into an adjoining reaction chamber for dry etching of one or more predetermined substrates placed therein. (An afterglow is defined herein as a gas that has been excited into a plasma state in the plasma generation chamber and subsequently removed therefrom with the afterglow including one or more activated chemical species having lifetimes of sufficient duration to produce an enhanced chemical reactivity when introduced into the adjoining reaction chamber wherein the etching occurs.) Such a downstream plasma etching system prevents possible damage to devices on the substrates from energetic ions and/or free electrons that may be present in the plasma.

Alternately, the ligands may be generated by activating the ligand source gas molecules by contact with energized particles such as photons, electrons, ions, energized atoms, energized molecules or the like. Furthermore, thermal activation energy may be provided to the transition metal to be etched and/or to the ligands forming the volatile complex by heating of the substrates.

In the case of photon generation of nitrogen- or phosphorous-containing π-acceptor ligands, a laser source or a lamp having an appropriate excitation energy or wavelength may be brought into contact with ligand source gases in a reaction chamber through one or more windows therein and used to activate the ligand source gas molecules, promoting the molecules into one or more excited energy states sufficiently energetic for photodissociation of the molecules for generation of the π-acceptor ligands. Alternately, the photons may be replaced by other energetic particles (e.g. electrons, ions, atoms or molecules) with sufficient energy being transferred to the ligand source gas molecules by collisional contact therewith for formation of the nitrogen- or phosphorous-containing π-acceptor ligands. Such ligand generation or formation is preferably performed in a reaction chamber maintained at a reduced pressure, with one or more predetermined substrates to be etched (for forming interconnects or for removing impurity deposits) located within the chamber (preferably on a heated stage or carriage, which according to certain embodiments of the present invention may be a lower electrode or plate of a parallel-plate reactive ion etching system). The reaction chamber is preferably provided with a load-locked side chamber or the like for transferring substrates into and out of the reaction chamber without exposing the insides of the chamber to the ambient atmosphere. The nitrogen- or phosphorous-containing p-acceptor ligands are provided proximate to the substrates for dry etching thereof; and a volatile complex formed from the transition metal to be etched and the nitrogen- or phosphorous-containing π-acceptor ligand(s) is preferably removed from the reaction chamber by a vacuum pump that is connected to the chamber for exhausting gases therefrom.

As another example, a chemically-assisted ion beam etching (CAIBE) system as known to the art may be used for practice of the present invention, with the ligand source gas admitted thereto at a predetermined pressure and the nitrogen- or phosphorous-containing π-acceptor ligands generated directly from the source gas, or by collisions with an ion beam (e.g. $Cl^-$ or the like) having a predetermined range of ion energy. The ion beam may assist in forming the p-acceptor ligands and/or in etching and volatilizing the transition metal (including a spatially-selective etching of the transition metal with or without a patterned masking layer).

According to preferred embodiments of the present invention, nitrosyl ligands may be formed from nitrogen-containing source gases other than nitric oxide by use of a plasma or energized particles as described heretofore. Such nitrogen-containing gases include nitrous oxide ($N_2O$), nitrogen dioxide ($NO_2$), nitrogen trioxide ($N_2O_3$), nitrosyl halides [including nitrosyl bromide (NOBr), nitrosyl chloride (NOCl) and nitrosyl fluoride (NOF)], or the like. Additionally, it may be possible to form nitrosyl ligands by chemical reactions of nitrogen-containing gases (e.g. $N_2$) with oxygen-containing gases (e.g. $O_2$) in a plasma, or by interaction with energized particles. For other embodiments of the invention using other of the nitrogen- or phosphorous-containing π-acceptor ligands as identified heretofore, predetermined ligand source gases may be provided for generating the π-acceptor ligands. Some of the above 90 -acceptor ligands are directly available from source gases; while others may be generated in a plasma or by interaction with energized particles as described heretofore.

The mechanism involved in accomplishing the dry etching is not well understood, but it is believed that depending on the particular transition metal (or alloy) to be etched, the nitrogen- or phosphorous-containing π-acceptor ligands react either directly with the transition metal, or else react with intermediary reaction products (i.e. intermediary complexes) formed by one or more intermediary reactant species being provided proximate to the transition metals. In the latter case, the intermediary reactant species are replaced at least in part by further chemical reactions with the nitrogen- or phosphorous-containing π-acceptor ligands.

In the case of chemical reactions of nitrosyl ligands with the intermediary complexes, it is expected that the nitrosyl ligands will be substituted at least in part for intermediary reactant species (e.g. halide and/or carbonyl ligands) thereby forming a final volatile complex including the nitrosyl ligands. Thus, according to the present invention, the volatile complex may include mixed carbonyl/nitrosyl complexes or mixed halide/nitrosyl complexes with transition metals formed by replacement reactions in which one or more carbonyl or halide ligands in the intermediary complexes are replaced by nitrosyl ligands. Similar substitutionary processes may be expected to occur for other nitrogen- and phosphorous-containing π-acceptor ligands used for practice of the present invention.

For a particular transition metal (or transition metal alloy) to be etched, a predetermined nitrogen- or phosphorous-containing π-acceptor ligand is preferably selected to provide a final reaction product complex (i.e. a volatile complex) having sufficient volatility for withdrawal from the reaction chamber by a vacuum pump connected thereto. According to some embodiments of the present invention, it may be preferable or necessary to heat the stage or carriage containing one or more predetermined substrates to be etched with a heater for sublimating the final reaction product complex for removal thereof. In these embodiments of the present invention, the stage or carriage is preferably heated and maintained at a temperature of up to about 200° C. or higher, with the exact temperature being determined by thermal characteristics or limitations of any masking layer (e.g a photoresist or the like) provided on the substrates for defining the portion of the metal thin-film to be etched for forming the interconnects. For use of the present invention for the cleaning of transition metal impurity deposits from one or more predetermined substrates (e.g. during initial stages of device formation), it may be preferable to use an even higher substrate temperature of up to about 600° C., again depending on the thermal limitations of any material layers present on the substrate.

While the present invention has embodiments in many different forms, two examples of preferred embodiments of the present invention are provided. In a first example according to the present invention, a downstream plasma etching system is used to etch thin films of the transition metal tungsten and the transition metal alloy tungsten silicide, with nitrosyl being used as a preferred π-acceptor ligand for forming a volatile complex therefrom. The thickness of the thin films provided on a silicon substrate for this first example of dry etching are about 300 nanometers of tungsten, and about 400 nanometers of tungsten silicide. In this first example, $N_2O$ is used as a nitrosyl source gas for generating nitrosyl ligands, and $CF_4$ is used as a halogen source gas for generating halide ligands (no carrier gas is provided for this first example of the present invention).

With a source gas mixture containing up to about 3% $CF_4$ and the remainder $N_2O$, etching rates of up to about 200 nanometers/minute were measured for tungsten, and up to about 300 nanometers/minute for tungsten silicide. The dry etching under these conditions is selective to tungsten and tungsten silicide, while being much less selective to other materials forming the substrate (e.g. silicon or GaAs). Furthermore, it is expected that the non-selectivity for etching of silicon dioxide and/or silicon nitride may be controllable and adjustable by controlling the amount of $CF_4$ (or other halogen source gas) in the source gas mixture. Furthermore, in this example, neglible etching of either tungsten or tungsten silicide occurred for $N_2O$ or $CF_4$ (i.e. less than about 3% $CF_4$ in $O_2$) used singly in the downstream plasma etching system, indicating that the halide ligands probably act as an intermediary reactant species with the nitrosyl ligands replacing the halide ligands at least in part for forming the final volatile complex.

In a second example according to the present invention, a parallel-plate reactive ion etching (RIE) system is used to etch thin films of tungsten and tungsten silicide, with $N_2O$ and $CF_4$ being used as the nitrosyl and halogen source gases, respectively. After initiation of etching, the tungsten and tungsten silicide thin films are etched at a rate of up to 100 to 150 nanometers/minute under the following conditions: about 10 standard cubic centimeters per minute (sccm) $N_2O$ flow rate, about 1 sccm $CF_4$ flow rate, about 125 milliTorr total pressure with the plasma on, and about 100 Watts rf power. For this second example, heating of the substrate is provided by the plasma, with no additional heating or cooling of the lower electrode or plate holding the substrate.

In other embodiments of the present invention, when a transition metal silicide is being etched, a chlorine-containing halogen source gas may be provided for volatilizing a silicon component of the silicide as $SiCl_4$.

The matter set forth in the foregoing description is offered by way of illustration only and not as a limitation. Other applications and variations of the method for dry etching of transition metals will become evident to those skilled in the art. The actual scope of the invention is intended to be defined in the following claims when viewed in their proper perspective based on the prior art.

What is claimed is:

1. A method for dry etching of a transition metal on a substrate, comprising the steps of:
   (a) providing a phosphite ligand comprising $P(OR)_3$ in proximity to the transition metal; and
   (b) etching the transition metal and forming a volatile complex comprising the phosphite ligand and the transition metal.

2. A method for dry etching of a transition metal on a substrate, comprising the steps of:
   (a) providing a substituted phosphine ligand selected from the group consisting of $PCl_2OR$, $PCl_2R$, $PBr_2R$, $PCl(OR)_2$ and $PClR_2$ in proximity to the transition metal; and
   (b) etching the transition metal and forming a volatile complex comprising the substituted phosphine ligand and the transition metal.

3. A method for dry etching of a transition metal on a substrate comprising the steps of:
   (a) providing at least one nitrogen- or phosphorous-containing π-acceptor ligand selected from the group consisting of isonitrile (RNC), cyanide (CN), isocyanide (RCN), phosphine ligands, substituted phosphine ligands and phosphite ligands in proximity to the transition metal in the form of an alloy selected from the group consisting of transition metal silicides, transition metal nitrides, and transition metal carbides; and
   (b) etching the transition metal and forming a volatile complex comprising the 90-acceptor ligand and the transition metal.

4. A method for dry etching of a transition metal on a substrate, comprising the steps of:
   (a) providing at least one nitrogen-containing π-acceptor ligand selected from the group consisting of isonitrile (RNC), cyanide (CN), and isocyanide (RCN) in proximity to the transition metal in the form of an alloy selected from the group consisting of transition metal silicides, transition metal nitrides, and transition metal carbides; and
   (b) etching the transition metal and forming a volatile complex comprising the π-acceptor ligand and the transition metal.

5. A method for dry etching of a transition metal on a substrate, comprising the steps of:
   (a) providing a phosphite π-acceptor ligand comprising $P(OR)_3$ in proximity to the transition metal; and (b) etching the transition metal and forming a volatile complex comprising the π-acceptor ligand and the transition metal.

6. A method for dry etching of a transition metal on a substrate, comprising the steps of:
(a) providing at least one substituted phosphine π-acceptor ligand selected from the group consisting of $PCl_2OR$, $PCl_2R$, $PBr_2R$, $PCl(OR)_2$ and $PClR_2$ in proximity to the transition metal; and
(b) etching the transition metal and forming a volatile complex comprising the π-acceptor ligand and the transition metal.

7. A method for dry etching of a transition metal on a substrate, comprising the steps of:
(a) providing at least one phosphorous-containing π-acceptor ligand in proximity to the transition metal in the form of an alloy selected from the group consisting of transition metal silicides, transition metal nitrides, and transition metal carbides; and
(b) etching the transition metal and forming a volatile complex comprising the π-acceptor ligand and the transition metal.

8. The method of claim 3 wherein the transition metal is in the form of an impurity on a surface of the substrate.

9. A method for patterning a transition metal layer on a substrate, comprising the steps of:
(a) forming a patterned masking layer above the transition metal layer comprising an alloy selected from the group consisting of transition metal silicides, transition metal nitrides, and transition metal carbides for exposing a portion of the transition metal layer;
(b) providing at least one nitrogen- or phosphorous-containing π-acceptor ligand selected from the group consisting of isonitrile (RNC), cyanide (CN), isocyanide (RCN), phosphine ligands, substituted phosphine ligands and phosphite ligands in proximity to the exposed portion of the transition metal layer; and
(c) removing the exposed portion of the transition metal layer as a volatile complex formed at least in part with the π-acceptor ligand.

10. The method of claim 1 wherein the step of etching the transition metal and forming a volatile complex is performed in a plasma etching system selected from the group consisting of reactive ion etching systems, downstream plasma etching systems, and chemically-assisted ion beam etching systems.

11. The method of claim 2 wherein the step of etching the transition metal and forming a volatile complex is performed in a plasma etching system.

12. The method of claim 3 further including a step for providing at least one ligand source gas for forming each π-acceptor ligand.

13. The method of claim 12 wherein each π-acceptor ligand is formed by activating the ligand source gas.

14. The method of claim 13 wherein activating the ligand source gas comprises contacting the ligand source gas with energized particles.

15. A method for dry etching of a transition metal on a substrate comprising the steps of:
(a) providing at least one ligand source gas, and activating the ligand source gas by contacting the ligand source gas with energized particles comprising photons provided by a laser source, thereby forming at least one nitrogen- or phosphorous-containing π-acceptor ligand:
(b) providing the π-acceptor ligand in proximity to the transition metal in the form of an alloy selected from the group consisting of transition metal silicides, transition metal nitrides, and transition metal carbides; and
(c) etching the transition metal and forming a volatile complex comprising the π-acceptor ligand and the transition metal.

16. A method for dry etching of a transition metal on a substrate comprising the steps of:
(a) providing at least one ligand source gas, and activating the ligand source gas by contacting the ligand source gas with energized particles comprising photons provided by a lamp, thereby forming at least one nitrogen- or phosphorous-containing π-acceptor ligand;
(b) providing the π-acceptor ligand in proximity to the transition metal in the form of an alloy selected from the group consisting of transition metal silicides, transition metal nitrides, and transition metal carbides; and
(c) etching the transition metal and forming a volatile complex comprising the π-acceptor ligand and the transition metal.

17. The method of claim 13 wherein activating the ligand source gas comprises contacting the ligand source gas with a plasma.

18. The method of claim 13 wherein activating the ligand source gas is performed in a reactive ion etching system.

19. The method of claim 13 wherein activating the ligand source gas is performed in a downstream plasma etching system.

20. The method of claim 13 wherein activating the ligand source gas is performed in a chemically-assisted ion beam etching system.

21. The method of claim 15 wherein the π-acceptor ligand is nitrosyl (NO).

22. The method of claim 3 wherein the π-acceptor ligand is isonitrile (RNC).

23. The method of claim 3 wherein the π-acceptor ligand is cyanide (CN).

24. The method of claim 3 wherein the π-acceptor ligand is isocyanide (RCN).

25. The method of claim 3 wherein the π-acceptor ligand is a phosphine ligand.

26. The method of claim 3 wherein the π-acceptor ligand is a substituted phosphine ligand.

27. The method of claim 3 wherein the π-acceptor ligand is a phosphite ligand.

28. A method for dry etching of a transition metal on a substrate comprising the steps of:
(a) providing at least on nitrogen- or phosphorous-containing π-acceptor ligand in proximity to the transition metal in the form of an alloy selected from the group consisting of transition metal silicides, transition metal nitrides, and transition metal carbides; and
(b) etching the transition metal and forming a volatile complex comprising the π-acceptor ligand, the transition metal and an organic ligand.

29. The method of claim 3 further including a step for providing an intermediary reactant species in proximity to the transition metal, with the intermediary reactant species being replaced at least in part by the π-acceptor ligand for forming the volatile complex.

30. The method of claim 29 wherein the intermediary reactant species comprises a carbonyl ligand.

31. The method of claim 29 wherein the intermediary reactant species comprises a halide ligand.

32. The method of claim 3 further including a step for heating the substrate to a temperature of up to 600° C.

33. The method of claim 3 further including a step for providing a carrier gas for bringing the at least one π-acceptor ligand in proximity to the transition metal alloy.

34. The method of claim 3 wherein the transition metal alloy is in the form of a thin-film layer deposited above a substrate, and further including a step for forming a patterned masking layer above the thin-film layer for exposing a portion of the thin-film layer for etching thereof.

35. The method of claim 4 wherein the nitrogen-containing π-acceptor ligand is provided by a nitrogen-containing ligand source gas.

36. The method of claim 35 further including a step for activating the ligand source gas and producing the π-acceptor ligand therefrom.

37. The method of claim 36 wherein the step for activating the ligand source gas comprises contacting the gas with a plasma.

38. The method of claim 36 wherein the step for activating the ligand source gas comprises contacting the gas with energized particles.

39. The method of claim 4 further including a step for providing an intermediary reactant species in proximity to the transition metal with the intermediary reactant species being replaced at least in part by the nitrogen-containing π-acceptor ligand for forming the volatile complex.

40. The method of claim 39 wherein the intermediary reactant species comprises a carbonyl ligand.

41. The method of claim 39 wherein the intermediary reactant species comprises a halide ligand.

42. The method of claim 4 further including a step for heating the substrate to a temperature of up to 600° C.

43. The method of claim 4 wherein the transition metal alloy is in the form of a thin-film layer deposited above the substrate, and further including a step for forming a patterned masking layer above the thin-film layer for exposing a portion of the thin-film layer for etching thereof.

44. The method of claim 6 wherein the step of etching the transition metal and forming a volatile complex is performed in a reactive ion etching system.

45. The method of claim 6 wherein the step of etching the transition metal and forming a volatile complex is performed in a downstream plasma etching system.

46. The method of claim 6 wherein the step of etching the transition metal and forming a volatile complex is performed in a chemically-assisted ion beam etching system.

47. The method of claim 6 further including a step for providing an intermediary reactant species in proximity to the transition metal with the intermediary reactant species being replaced, at least in part, by the substituted phosphine π-acceptor ligand for forming the volatile complex.

48. The method of claim 47 wherein the intermediary reactant species comprises a carbonyl ligand.

49. The method of claim 47 wherein the intermediary reactant species comprises a halide ligand.

50. The method of claim 6 further including a step for heating the substrate to a temperature of up to 600° C.

51. The method of claim 6 wherein the transition metal is in the form of a thin-film layer deposited above the substrate, and further including a step for forming a patterned masking layer above the thin-film layer for exposing a portion of the thin-film layer for etching thereof.

52. The method of claim 7 further including a step for providing an intermediary reactant species in proximity to the transition metal alloy with the intermediary reactant species being replaced at least in part by the phosphorous-containing π-acceptor ligand for forming the volatile complex.

53. The method of claim 52 wherein the intermediary reactant species comprises a carbonyl ligand.

54. The method of claim 52 wherein the intermediary reactant species comprises a halide ligand.

55. The method of claim 52 further including a step for heating the substrate to a temperature of up to 600° C.

56. The method of claim 52 wherein the transition metal alloy is in the form of a thin-film layer deposited above the substrate, and further including a step for forming a patterned masking layer above the thin-film layer for exposing a portion of the thin-film layer for etching thereof.

57. The method of claim 15 wherein the π-acceptor ligand is isonitrile (RNC).

58. The method of claim 15 wherein the π-acceptor ligand is cyanide (CN).

59. The method of claim 15 wherein the π-acceptor ligand is isocyanide (RCN).

60. The method of claim 15 wherein the π-acceptor ligand is a phosphine ligand.

61. The method of claim 15 wherein the π-acceptor ligand is a substituted phosphine ligand.

62. The method of claim 15 wherein the π-acceptor ligand is a phosphite ligand.

63. The method of claim 16 wherein the π-acceptor ligand is nitrosyl (NO).

64. The method of claim 16 wherein the π-acceptor ligand is isonitrile (RNC).

65. The method of claim 16 wherein the π-acceptor ligand is cyanide (CN).

66. The method of claim 16 wherein the π-acceptor ligand is isocyanide (RCN).

67. The method of claim 16 wherein the π-acceptor ligand is a phosphine ligand.

68. The method of claim 16 wherein the π-acceptor ligand is a substituted phosphine ligand.

69. The method of claim 16 wherein the π-acceptor ligand is a phosphite ligand.

* * * * *